(12) United States Patent
Oba et al.

(10) Patent No.: US 11,640,197 B2
(45) Date of Patent: May 2, 2023

(54) COUNTER UNIT

(71) Applicant: OMRON Corporation, Kyoto (JP)

(72) Inventors: Hitoshi Oba, Kameoka (JP); Masaya Kudo, Osaka (JP)

(73) Assignee: OMRON Corporation, Kyoto (JP)

( * ) Notice: Subject to any disclaimer, the term of this patent is extended or adjusted under 35 U.S.C. 154(b) by 15 days.

(21) Appl. No.: 17/605,553

(22) PCT Filed: Mar. 2, 2020

(86) PCT No.: PCT/JP2020/008576
§ 371 (c)(1),
(2) Date: Oct. 21, 2021

(87) PCT Pub. No.: WO2020/230411
PCT Pub. Date: Nov. 19, 2020

(65) Prior Publication Data
US 2022/0121266 A1    Apr. 21, 2022

(30) Foreign Application Priority Data

May 10, 2019    (JP) .............................. JP2019-090132

(51) Int. Cl.
*G06F 1/32*    (2019.01)
*G06F 1/3287*    (2019.01)
(Continued)

(52) U.S. Cl.
CPC ........... *G06F 1/3287* (2013.01); *G01R 25/08* (2013.01); *G06F 1/3215* (2013.01)

(58) Field of Classification Search
CPC .................................. G01R 25/08; G06F 1/32
See application file for complete search history.

(56) References Cited

U.S. PATENT DOCUMENTS

2011/0122921 A1* 5/2011 McCorkle ............ H04B 1/7174
375/E1.001
2013/0332708 A1* 12/2013 Morrison ................ H04L 47/10
712/225

FOREIGN PATENT DOCUMENTS

JP    S61173162    8/1986
JP    H06288791    10/1994
(Continued)

OTHER PUBLICATIONS

"International Search Report (Form PCT/ISA/210) of PCT/JP2020/008576," dated Apr. 7, 2020, with English translation thereof, pp. 1-5.

(Continued)

*Primary Examiner* — Paul B Yanchus, III
(74) *Attorney, Agent, or Firm* — JCIPRNET (57) ABSTRACT

Provided is a counter unit capable of supporting any output apparatus of single-phase output, two-phase output, or three-phase output without waste. A counter unit (10) is provided with: a plurality of signal input terminals to which pulse signals outputted from a plurality of external output apparatuses (50) are respectively inputted; input circuits (21a to 21f) respectively connected to the plurality of signal input terminals; a single-phase counter (13) that performs count on the basis of a single-phase pulse signal, and a multi-phase counter (15) that performs count on the basis of a multi-phase pulse signal; and a switching part (16) that switches whether the input circuits (21a to 21f) are connected to the single-phase counter (13) or the multi-phase counter (15).

4 Claims, 8 Drawing Sheets

(51) Int. Cl.
*G01R 25/08* (2006.01)
*G06F 1/3215* (2019.01)

(56) References Cited

FOREIGN PATENT DOCUMENTS

| | | | |
|---|---|---|---|
| JP | 2010014578 | | 1/2010 |
| JP | 2010026010 | | 2/2010 |
| JP | 2010026010 A | * | 2/2010 |
| JP | 2010118981 | | 5/2010 |
| JP | 2010135974 | | 6/2010 |
| JP | 2012014497 | | 1/2012 |
| JP | 2019070603 | | 5/2019 |

OTHER PUBLICATIONS

"Written Opinion of the International Searching Authority (Form PCT/ISA/237) of PCT/JP2020/008576," dated Apr. 7, 2020, with English translation thereof, pp. 1-8.
Office Action of Japan Counterpart Application, with English translation thereof, dated Jan. 31, 2023, pp. 1-5.

* cited by examiner

| OUT1 | OUT2 | A1+ | A2+ |
|------|------|------|------|
| IOV | IOV | COMA1 | COMA2 |
| OUT3 | OUT4 | B1+ | B2+ |
| IOV | IOV | COMB1 | COMB2 |
| OUT5 | OUT6 | Z1+ | Z2+ |
| IOV | IOV | COMZ1 | COMZ2 |
| IN1 | IN2 | IN3 | IN4 |
| IOG | IOG | IOG | IOG |

COUNTER UNIT

CROSS-REFERENCE TO RELATED APPLICATION

This application is a 371 application of the International PCT application serial no. PCT/JP2020/008576, filed on Mar. 2, 2020, which claims the priority benefits of Japan Patent Application No. 2019-090132, filed on May 10, 2019. The entirety of each of the above-mentioned patent applications is hereby incorporated by reference herein and made a part of this specification.

TECHNICAL FIELD

The present invention relates to a counter unit that counts input digital pulses.

BACKGROUND ART

In the related art, in a control system, a counter unit having a plurality of input channels and capable of counting count values of multiple channels is known. This counter unit has three-phase inputs of A, B, and Z phases per channel (refer to, for example, Patent Literature 1), or two-phase inputs of A and B phases per channel (refer to, for example, Patent Literature 2).

CITATION LIST

Patent Literature

Patent Literature 1

Japanese Patent Laid-Open No. 2010-14578

Patent Literature 2

Japanese Patent Laid-Open No. 2010-135974

SUMMARY OF INVENTION

Technical Problem

A counter unit supporting the above three-phase or two-phase output apparatus includes an input channel having three input terminals corresponding to a three-phase pulse signal, or an input channel having two input terminals corresponding to a two-phase pulse signal. There is also a counter unit having a plurality of input channels corresponding to three-phase or two-phase output apparatuses.

On the other hand, as an output apparatus used by being connected to a counter unit having a plurality of input channels, there is also an output apparatus such as a flow meter that outputs a single-phase pulse. In a case where an output apparatus that performs such single-phase pulse output is connected to a counter unit that has a three-phase input or a two-phase input, or an output apparatus that performs two-phase pulse output is connected to a counter unit that has a three-phase input, there is a problem that an unused input is generated and thus waste occurs.

One aspect of the present invention has been made in view of the above circumstances, and an objective thereof is to provide a counter unit capable of being connected with efficient use of a plurality of signal input terminals for any of output apparatuses of single-phase output, two-phase output, or three-phase output.

Solution to Problem

In order to solve the above problems, the counter unit according to one aspect of the present invention includes a plurality of signal input terminals to which pulse signals output from a plurality of external output apparatuses are input; an input circuit that is connected to each of the plurality of signal input terminals; a single-phase counter that performs counting on the basis of a single-phase pulse signal, and a multi-phase counter that performs counting on the basis of multi-phase pulse signals; and a switching part that switches between whether the input circuit is connected to the single-phase counter or the multi-phase counter.

Advantageous Effects of Invention

According to one aspect of the present invention, the counter unit can be connected with efficient use of a plurality of signal input terminals for any of output apparatuses of single-phase output, two-phase output, or three-phase output.

DESCRIPTION OF EMBODIMENTS

Hereinafter, an embodiment according to one aspect of the present invention (hereinafter, also referred to as the "present embodiment") will be described with reference to the drawings.

1. Application Example (Overview of Control System)

Figure 1:
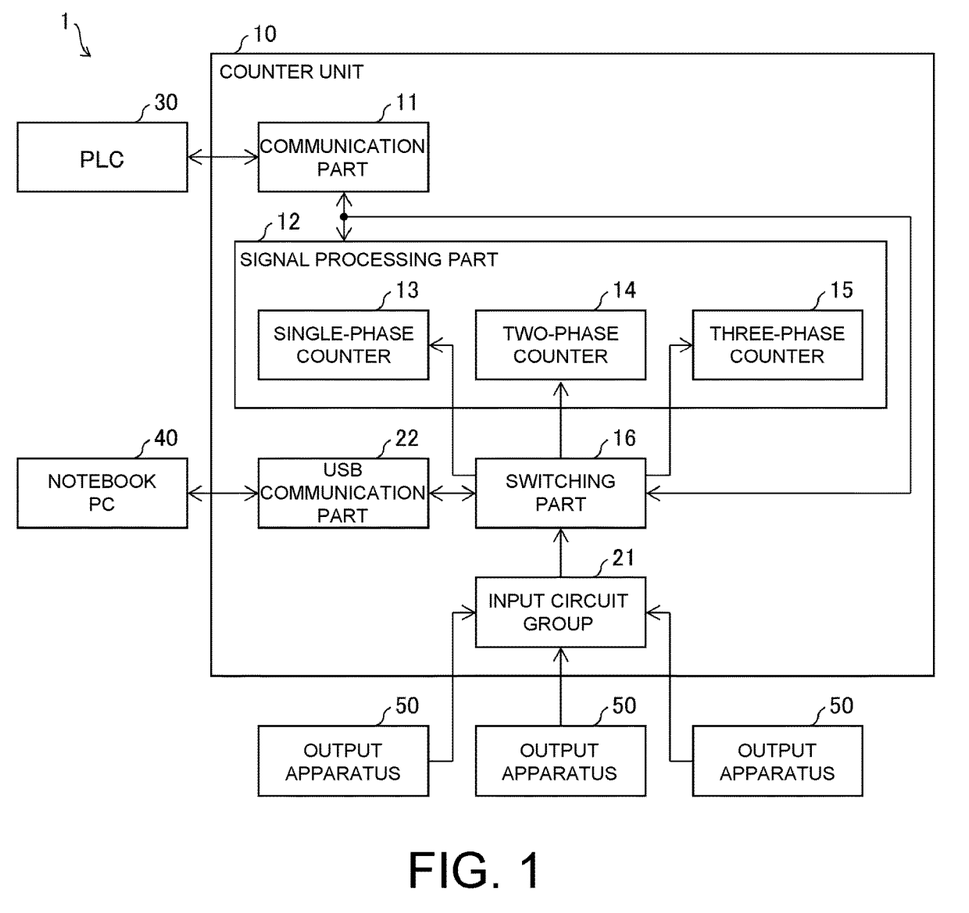
FIG. 1 is a block diagram illustrating a schematic configuration of a control system in which a counter unit according to an embodiment of the present invention is used.

FIG. 1 is a block diagram illustrating a schematic configuration of the entire control system 1 including a counter unit 10. As illustrated in FIG. 1, the control system 1 includes the counter unit 10 and a programmable logic controller (PLC) 30. The control system 1 further includes a plurality of output apparatuses 50 that output pulse signals. The control system 1 may include a notebook PC 40 as a setting apparatus.

In the control system 1, the counter unit 10 receives a pulse signal generated by the output apparatus 50 as an input, and uses a count value obtained by counting the number of pulses of the received pulse signal to measure an operation state of the output apparatus 50 such as an encoder. The counter unit 10 transmits information indicated by the count value obtained by counting the pulse signals output by the output apparatus 50 to the PLC 30 in every control period of the PLC 30.

The counter unit 10 includes a plurality of signal input terminals (details thereof will be described later) to which pulse signals output from one or a plurality of external output apparatuses 50 are input, and an input circuit group 21 having input circuits respectively connected to the plurality of signal input terminals.

The counter unit 10 includes a single-phase counter 13 that counts the number of pulses of the pulse signal from the single-phase output apparatus 50, a two-phase counter 14 that counts the number of pulses of the pulse signal from the two-phase output apparatus 50, and a three-phase counter 15 that counts the number of pulses of the pulse signal from the three-phase output apparatus 50.

The counter unit 10 includes a switching part 16 that switches between whether each of the input circuits of the input circuit group 21 is connected to the single-phase counter 13, the two-phase counter 14, or the three-phase counter 15. The switching part 16 switches between whether each input circuit of the input circuit group 21 is connected to the single-phase counter 13, the two-phase counter 14, or the three-phase counter 15 depending on whether the output apparatus 50 connected to each signal input terminal is a single-phase output apparatus, a two-phase output apparatus, or a three-phase output apparatus.

The counter unit 10 may be used, for example, by respectively connecting the output apparatuses 50 of single-phase output to, for example, six signal input terminals. The counter unit 10 may be used by respectively connecting the output apparatuses 50 of three-phase output to, for example, a first channel Ch1 including three signal input terminals and a second channel Ch2 including another three signal input terminals. The counter unit 10 may be used by respectively connecting two output apparatuses 50 of two-phase output to, for example, a first channel Ch1 including two signal input terminals and a second channel Ch2 including another two signal input terminals. The counter unit 10 may be used by further connecting the output apparatus 50 of two-phase output to a third channel Ch3 including still another two signal input terminals.

In a case where the single-phase output apparatus 50 is connected to any of the signal input terminals, the switching part 16 connects the corresponding input circuit to the single-phase counter 13. In a case where the two-phase output apparatus 50 is connected to any of the signal input terminals, the switching part 16 connects the corresponding input circuit to the two-phase counter 14. In a case where the three-phase output apparatus 50 is connected to any of the signal input terminals, the switching part 16 connects the corresponding input circuit to the three-phase counter 15.

As described above, the counter unit 10 may switch between whether each input circuit of the input circuit group 21 connected to the output apparatus 50 is connected to the single-phase counter 13, the two-phase counter 14, or the three-phase counter 15. Thus, it is possible to provide the counter unit 10 capable of efficiently using a plurality of signal input terminals to support any of output apparatuses 50 of single-phase output, two-phase output, and three-phase output.

2. Configuration Example

A configuration of the counter unit 10 according to the embodiment will be described in detail below with reference to FIGS. 1 to 3. In the present embodiment, the output apparatus 50 connected to the counter unit 10 is assumed to be an NPN type open collector output type apparatus. The output apparatus 50 is, for example, an encoder, a flow meter, a linear scale, a photoelectric sensor, or a proximity sensor that outputs a single-phase pulse signal as an open collector output. The output apparatus 50 is a two-phase output type rotary encoder or the like that outputs two-phase pulse signals with A and B phases. The output apparatus 50 is a three-phase output type rotary encoder or the like that outputs three-phase pulse signals with A, B, and Z phases.

The output apparatus 50 is not limited to an NPN type apparatus, and may be a PNP type open collector output type apparatus. The output apparatus 50 may be a line driver output type apparatus. The counter unit 10 receives a pulse signal generated by the output apparatus 50 as an input, and measures a state of a workpiece or the like by using a count value obtained by counting the number of pulses of the received pulse signal.

The counter unit 10 is communicatively connected to the PLC 30 via, for example, a field network, and transmits and receives data to and from the PLC 30. The PLC 30 is a control device (controller) that comprehensively controls the entire control system 1. The counter unit 10 transmits and receives data to and from the PLC 30 at constant time intervals in every control period of the PLC 30. For example, the counter unit 10 transmits, to the PLC 30, information indicated by a count value obtained by counting pulse signals output by the output apparatus 50 in every control period of the PLC 30.

A user may change a switching operation of the switching part 16 of the counter unit 10 by operating a setting program (tool) operating on the notebook PC 40.

In the present embodiment, the configuration in which the notebook PC 40 as an example of a setting apparatus changing a switching operation of the switching part 16 is connected to the counter unit 10 is described, but the notebook PC 40 is only an example, and any terminal apparatus including a display part configured with a liquid crystal panel or the like and an operation part configured with a touch panel, a keyboard, a mouse, or the like may be used as the setting apparatus. The PLC 30 may function as a setting apparatus, and the PLC 30 may transmit an instruction for changing the switching operation of the switching part 16 to the counter unit 10.

(Configuration of Counter Unit 10)

The counter unit 10 includes a communication part 11, a signal processing part 12, and the input circuit group 21. The counter unit 10 includes the switching part 16. The counter unit 10 includes a USB communication part 22.

The communication part 11 repeatedly communicates with the PLC 30 in every control period of the PLC 30 and executes data transmission and reception. The communication part 11 is realized by using, for example, an integrated circuit such as a communication integrated circuit (IC).

The counter unit 10 and the PLC 30 may be communicatively connected to each other via, for example, a field network. As the field network connecting the counter unit 10 to the PLC 30, various types of industrial Ethernet (registered trademark) may be typically used. As industrial Ethernet (registered trademark), for example, EtherCAT (registered trademark), Profile IRT, MECHATROLINK (registered trademark)-III, Powerlink, SERCOS (registered trademark)-III, CIP Motion, and the like are known, and any of these may be employed. A field network other than industrial Ethernet (registered trademark) may be used. For example, in a case where motion control is not performed, DeviceNet, CompoNet/IP (registered trademark), or the like may be used.

The counter unit 10 may be integrally formed with the PLC 30, or may be communicatively connected to the PLC 30 via an internal bus.

The signal processing part 12 includes a single-phase counter 13, a two-phase counter 14, and a three-phase counter 15. The signal processing part 12 counts the number of pulses of a pulse signal output by the output apparatus 50 according to a set value that is set in advance by using the functions of the counters 13, 14, and 15. The signal processing part 12 may realize the functions of the counters 13, 14, and 15 with hardware by using a counter function or the like inside an MPU. The signal processing part 12 may realize the functions of the counters 13, 14 and 15 by using an IC such as a field programmable gate array (FPGA) or an application specific integrated circuit (ASIC).

The signal processing part 12 measures a state of a workpiece or the like by using count results in the counters 13, 14, and 15. The signal processing part 12 is realized by software by using, for example, a central processing unit (CPU) or a micro processor unit (MPU). The count results in the signal processing part 12 are output to the PLC 30 which is a host device by the communication part 11 in every predetermined communication period via the communication line.

The input circuit group 21 includes a plurality of signal input terminals A1, A2, B1, B2, Z1, Z2, and input circuits 21a to 21f (refer to FIGS. 5 to 8) respectively connected to the signal input terminals. A pulse signal output from one or a plurality of output apparatuses 50 is input to each of the signal input terminals A1, A2, B1, B2, Z1, and Z2. The input circuit group 21 includes a plurality of common signal terminals COMA1, COMA2, COMB1, COMB2, COMZ1, and COMZ2 respectively connected to common signal lines of one or a plurality of output apparatuses 50.

The switching part 16 switches between the single-phase counter 13, the two-phase counter 14, and the three-phase counter 15 to be connected to the input circuits 21a to 21f.

The USB communication part 22 has a USB port and communicates with the notebook PC 40 via a USB cable connected to the USB port. The USB communication part 22 receives a signal indicating an instruction from the setting program operating on the notebook PC 40. The signal received by the USB communication part 22 and indicating the instruction from the setting program operating on the notebook PC 40 includes an instruction for a switching operation of the switching part 16, and the USB communication part 22 functions as a switching reception part that receives the instruction for the switching operation via a communication line.

As described above, the counter unit 10 receives the instruction for the switching operation of the switching part 16 from the notebook PC 40 via the USB communication part 22, and the switching part 16 can control the switching operation of switching whether the input circuit is connected to the single-phase counter 13, the two-phase counter 14, or the three-phase counter 15 in response to the instruction.

(Hardware Configuration of Counter Unit)

Figure 2:
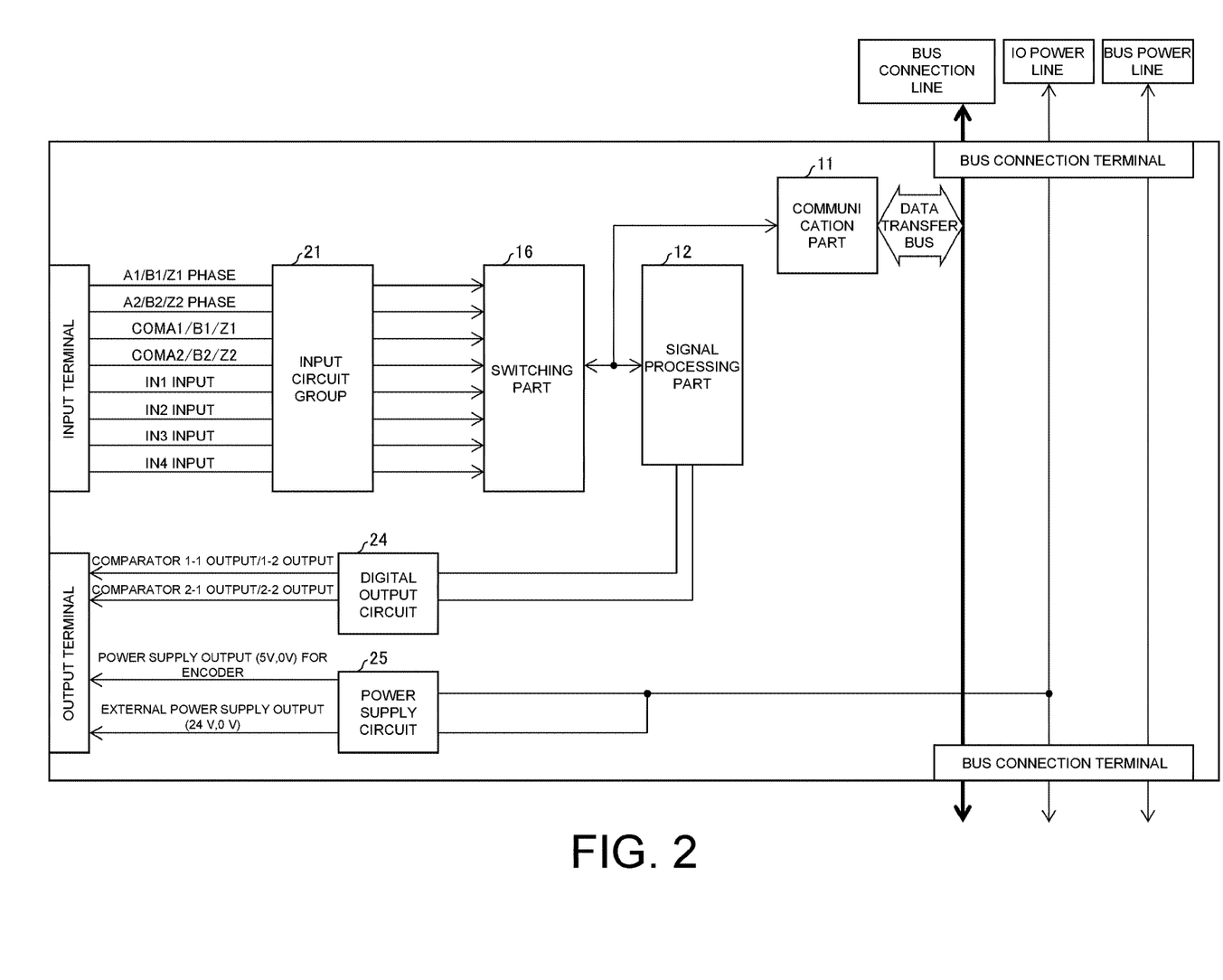
FIG. 2 is a block diagram illustrating a hardware configuration of the counter unit.
Figure 3:
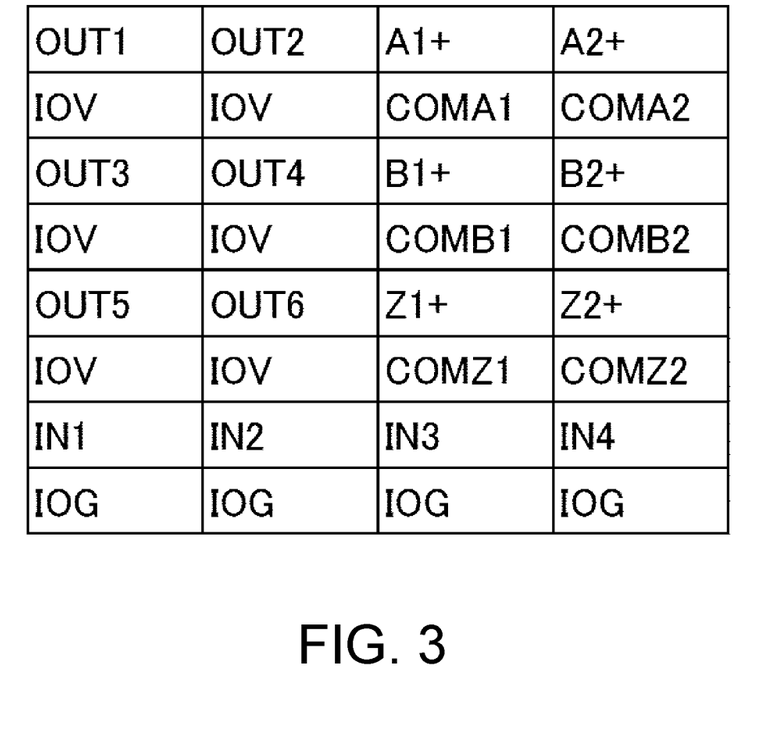
FIG. 3 is a diagram illustrating an example of a terminal block of the counter unit.

FIG. 2 is a diagram illustrating a hardware configuration of the counter unit 10. FIG. 3 is a diagram illustrating an arrangement example of a terminal block of the counter unit 10. As illustrated in FIGS. 2 and 3, the counter unit 10 has the signal input terminals A1, A2, B1, B2, Z1, Z2, the common signal terminals COMA1, COMA2, COMB1, COMB2, COMZ1, and COMZ2, and control signal input terminals IN1 to IN4 as input terminals.

The counter unit 10 includes comparator output terminals OUT1 to OUT6, six positive electrode power supply terminals IOV, and four negative electrode power supply terminals IOG as output terminals. The power supply terminals IOV and IOG include power supply output terminals (5 V, 0 V) for an encoder and power supply output terminals (24 V, 0 V) for an external power supply.

The power supply terminals IOV and IOG are connected to a power supply circuit 25 inside the counter unit 10.

The switching part 16 has (1) a function of performing digital filtering process on an input pulse signal and (2) a function of switching between the single-phase counter 13, the two-phase counter 14, and the three-phase counter 15 to be connected to the input circuits 21a to 21f. Regarding the filtering process of the switching part 16, validity/invalidity of filtering and filtering conditions may be set by a user through setting using the program of the PLC 30 or by operating the notebook PC 40. The switching part 16 is realized by, for example, a complex programmable logic device (CPLD), an FPGA, or an ASIC.

The signal processing part 12 is realized by, for example, a CPU. The signal processing part 12 counts pulse signals by using the functions of the counters 13, 14 and 15, and outputs a count result. Each of the single-phase counter 13, the two-phase counter 14, and the three-phase counter 15 has a buffer for temporarily storing count results for a plurality of times.

The signal processing part 12 executes an oversampling process, and outputs the count results for a plurality of times temporarily stored in the buffers of the counters 13, 14, and 15 to the PLC 30 via a communication line in every predetermined communication period by using the function of the communication part 11.

The signal processing part 12 executes an interruption process at the time of oversampling or an interruption process based on input synchronization. The signal processing part 12 is not limited to the configuration in which it is realized by a CPU, and may be realized by a CPLD, an FPGA, or an ASIC.

(Oversampling Process)

Figure 4:
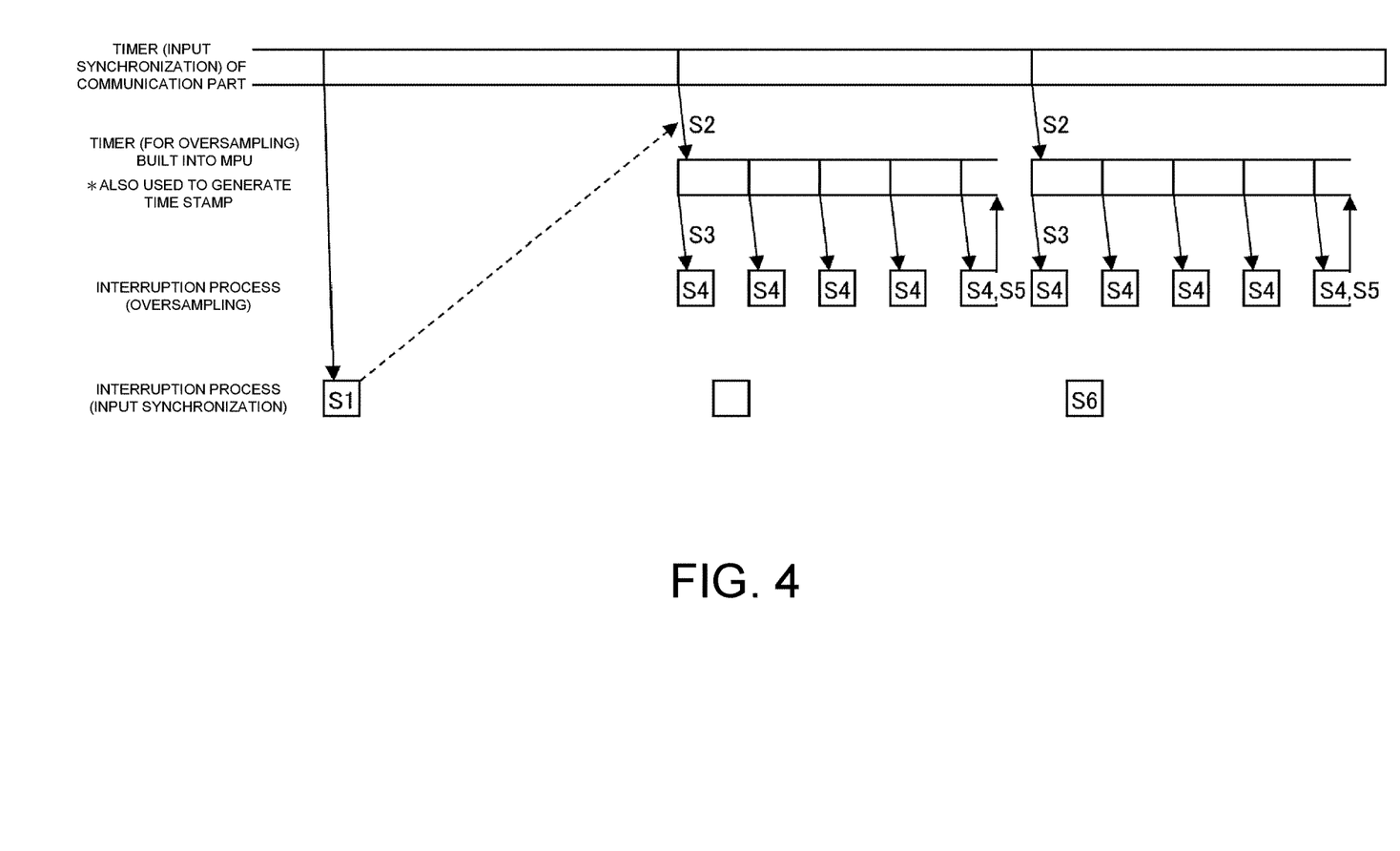
FIG. 4 is a diagram illustrating a structure of an over-sampling process.

FIG. 4 is a diagram illustrating a structure of an oversampling process performed by the signal processing part 12. FIG. 4 illustrates an example of an oversampling process of the signal processing part 12 that counts pulse signals with the Descriptor System data Transfer Controller (DSTC) with the time-up of a timer built into the MPU as a trigger.

The signal processing part 12 synchronizes a timer of the communication part 11 for input synchronization that synchronizes communication between the communication part 11 and the PLC 30 with the timer built into the MPU for oversampling. The signal processing part 12 also uses the timer built into the MPU for generating a time stamp.

First, at a synchronization timing of the timer of the communication part 11, the signal processing part 12 performs an interruption process (input synchronization) in which the timer built into the MPU is set to be started by the DSTC at the next time-up (step S1).

Subsequently, the signal processing part 12 starts the timer built into the MPU with the DSTC (step S2). The timer built into the MPU is set such that the time is immediately up for the first time.

The signal processing part 12 acquires and stores a value that is a source of counting of a high-speed counter by the DSTC, with the time-up of the timer built into the MPU as a trigger (step S3).

In the interruption process, the signal processing part 12 generates a high-speed counter value (count result) on the basis of the value stored in step S3, and performs an interruption process (oversampling) of writing the value into a buffer area of the communication part 11 (step S4). The buffer area of the communication part 11 has a double buffer configuration, and the signal processing part 12 switches to a different buffer area in every period and writes a count result thereinto.

The signal processing part 12 stops the timer built into the MPU when processing for the number of times of sampling per period is completed (step S5). In processing in the next period, the signal processing part 12 performs resynchronization by performing the process from the above step S2 again.

At the start of the processing in the next period, the signal processing part 12 performs an interruption process (input synchronization) of generating other buffer data and starting a process of transmitting data in the buffer area of the communication part 11 (step S6).

(Single-Phase Input Mode)

Figure 5:
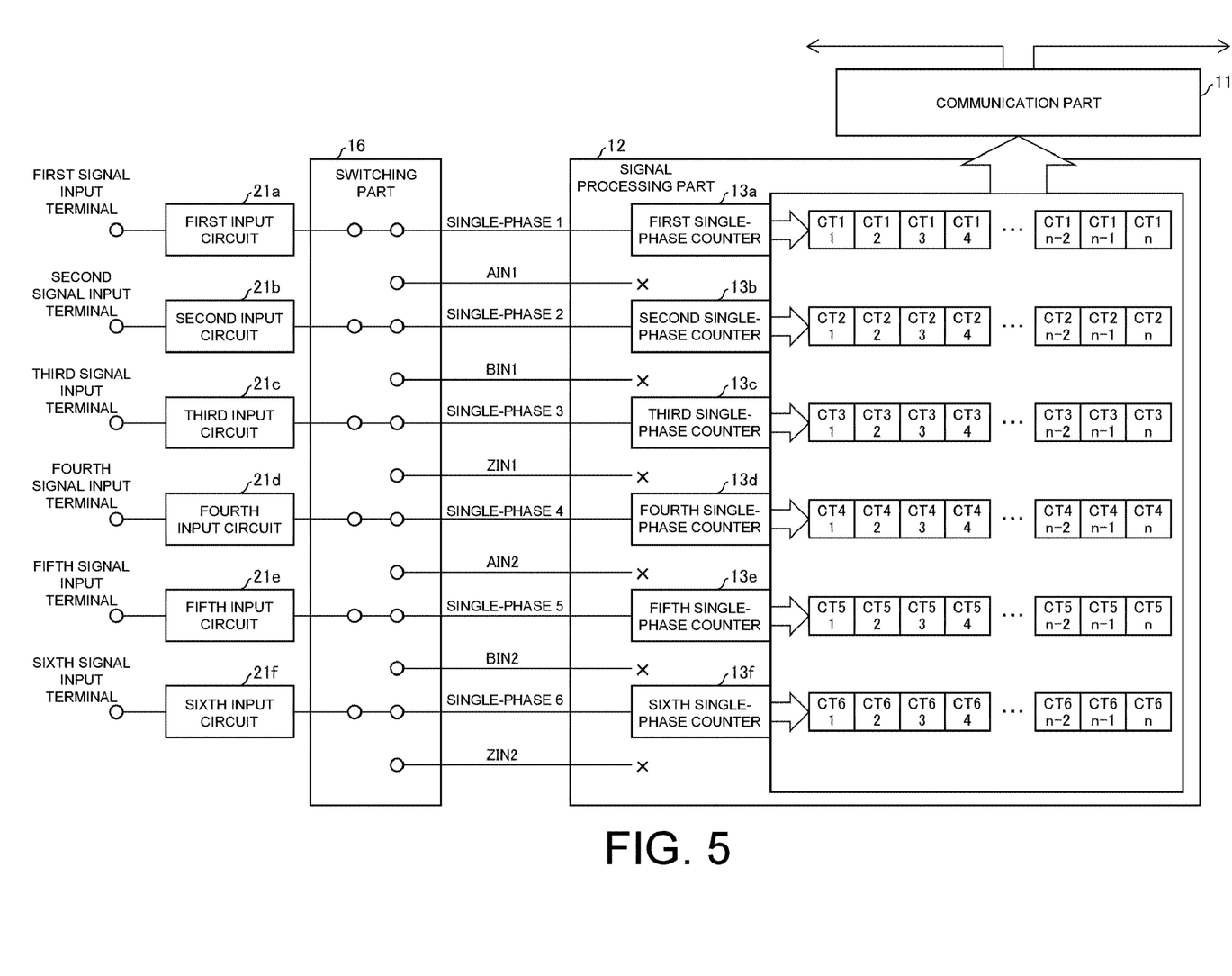
FIG. 5 is a wiring connection diagram of the counter unit in a single-phase mode in which the counter unit is used by being connected to an output apparatus of single-phase output.

FIG. 5 illustrates a state of wiring connection of the counter unit 10 in a case where the output apparatus 50 of single-phase output is connected to each of the first to sixth signal input terminals configured with the signal input terminals A1, A2, B1, B2, Z1, and Z2. As illustrated in FIG. 5, in a case where the output apparatus 50 of single-phase output is connected to each of the first signal input terminal to the sixth signal input terminal, a user operates the notebook PC 40 to perform connection switching in the switching part 16 such that the first input circuit 21*a* to the sixth input circuits 21*f* are respectively connected to a first single-phase counter 13*a* to a sixth single-phase counter 13*f*.

The switching part 16 connects the first input circuit 21*a* to the sixth input circuit 21*f* to respective single-phase signal lines (single-phases 1 to 6) respectively connected to the first single-phase counter 13*a* to the sixth single-phase counter 13*f*.

The signal processing part 12 performs counting on the basis of single-phase pulse signals that are respectively input to the first single-phase counter 13*a* to the sixth single-phase counter 13*f*. The signal processing part 12 transmits the count results stored in the buffers corresponding to the first single-phase counters 13*a* to the sixth single-phase counters 13*f* to the PLC 30 via the communication part 11 in predetermined communication periods.

(Three-Phase Input Mode)

Figure 6:
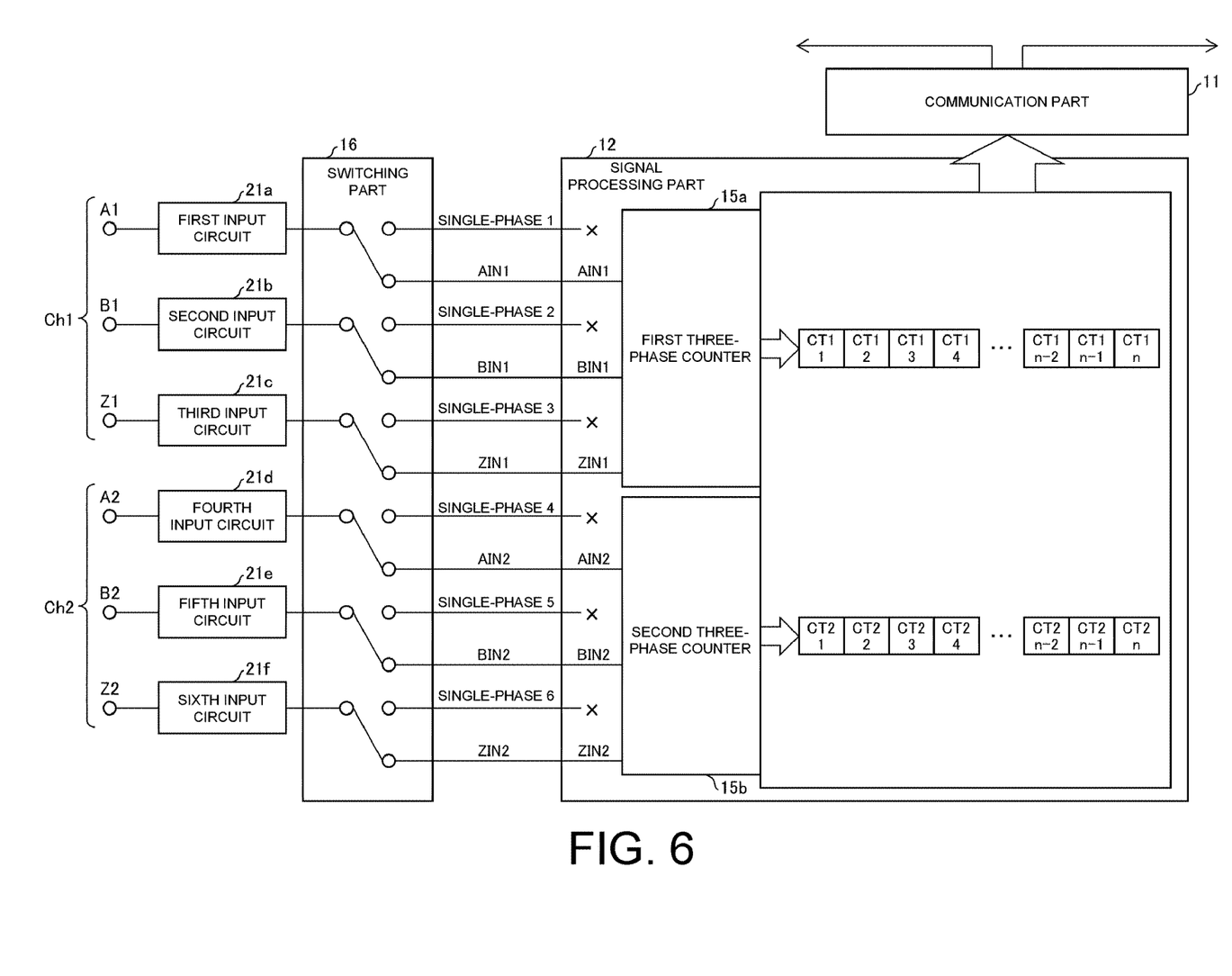
FIG. 6 is a wiring connection diagram of the counter unit in a three-phase mode in which the counter unit is used by being connected to an output apparatus of three-phase output.

FIG. 6 illustrates a state of wiring connection of the counter unit 10 in a case where the output apparatuses 50 of three-phase output are respectively connected to the channel Ch1 including the signal input terminals A1, B1 and Z1 and the channel Ch2 including the signal input terminals A2, B2 and Z2. As illustrated in FIG. 6, in a case where the output apparatus 50 of three-phase output is connected to each of the channels Ch1 and Ch2, the user operates the notebook PC 40 to perform connection switching in the switching part 16 such that the first input circuit 21*a* to the third input circuit 21*c* are connected to a first three-phase counter 15*a*, and the fourth input circuit 21*d* to the sixth input circuit 21*f* are connected to a second three-phase counter 15*b*.

The switching part 16 connects the first input circuit 21*a* to the third input circuit 21*c* to an A-phase signal line AIN1, a B-phase signal line BIN1, and a Z-phase signal lines ZIN1, respectively, connected to the first three-phase counter 15*a*. The switching part 16 connects the fourth input circuit 21*d* to the sixth input circuit 21*f* to an A-phase signal line AIN2, a B-phase signal line BIN2, and a Z-phase signal line ZIN2, respectively, connected to the second three-phase counter 15*b*.

The signal processing part 12 performs counting on the basis of three-phase pulse signals with the A-phase, B-phase, and Z-phase input to the first three-phase counter 15*a* and the second three-phase counter 15*b*, respectively. The signal processing part 12 transmits count results stored in buffers respectively corresponding to the first three-phase counter 15*a* and the second three-phase counter 15*b* to the PLC 30 via the communication part 11 in every predetermined communication period.

(Two-Phase Input Mode)

Figure 7:
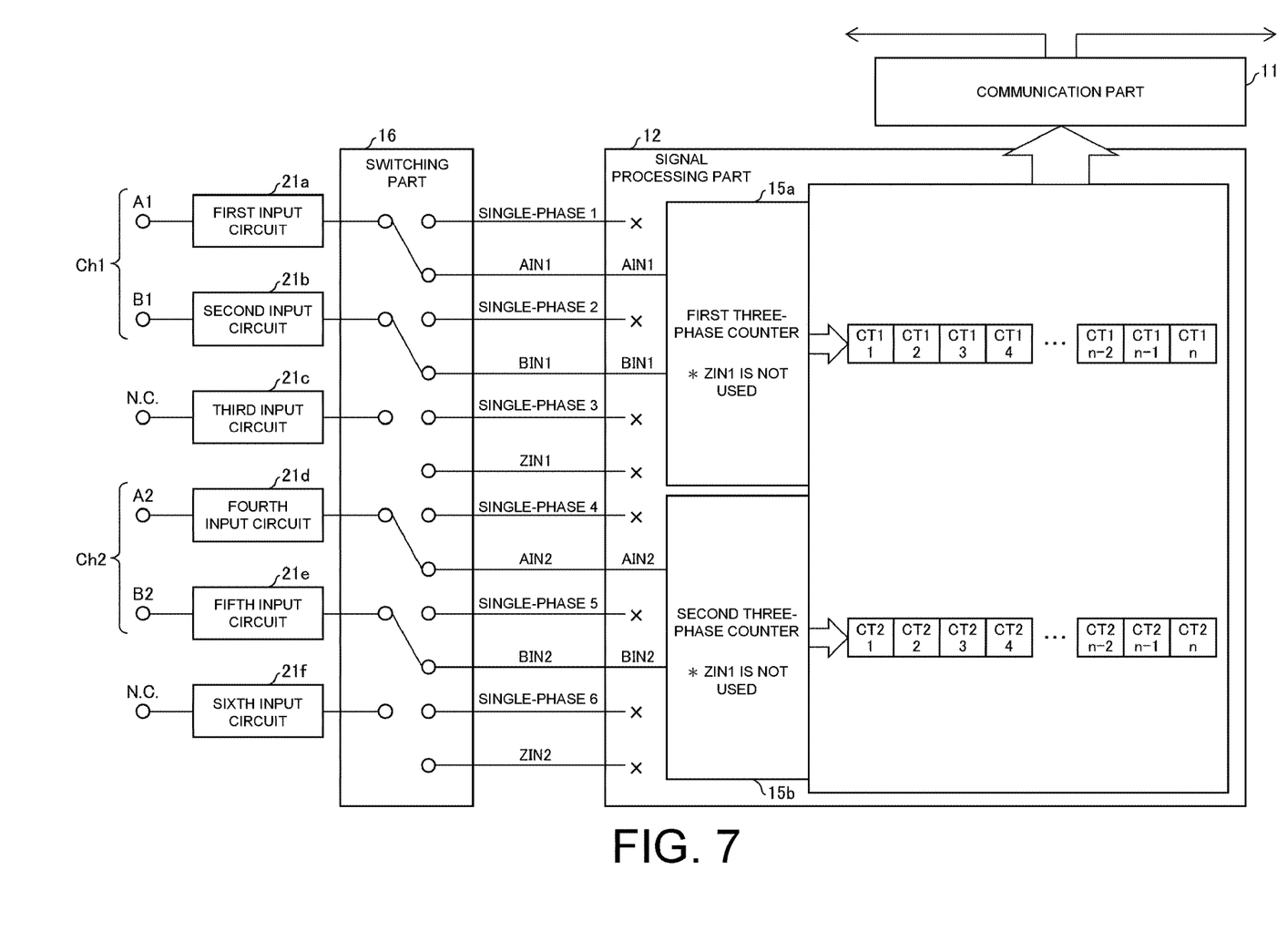
FIG. 7 is a wiring connection diagram of the counter unit in a two-phase mode in which the counter unit is used by being connected to an output apparatus of two-phase output.

FIG. 7 illustrates a state of wiring connection of the counter unit 10 in a case where the output apparatuses 50 of two-phase output are respectively connected to the channel Ch1 including the signal input terminals A1, B1, and Z1 and the channel Ch2 including the signal input terminals A2, B2, and Z2. As illustrated in FIG. 7, in a case where the output apparatus 50 of two-phase output is connected to each of the channels Ch1 and Ch2, signal lines are connected to the signal input terminals A1 and B1 and the signal input terminals A2 and B2, and the signal input terminals Z1 and Z2 are in a non-connected (NC) state in which signal lines are not connected thereto.

In a case where the output apparatuses 50 of two-phase output are respectively connected to the channels Ch1 and Ch2, the user operates the notebook PC 40 to perform connection switching in the switching part 16 such that the first input circuit 21*a* and the second input circuit 21*b* are connected to the first three-phase counter 15*a*, and the fourth input circuit 21*d* and the fifth input circuit 21*e* are connected to the second three-phase counter 15*b*.

The switching part 16 connects the first input circuit 21*a* and the second input circuit 21*b* to the A-phase input line AIN1 and the B-phase input line BIN1, respectively, connected to the first three-phase counter 15*a*. The switching part 16 connects the fourth input circuit 21*d* and the fifth input circuit 21*e* to the A-phase input line AIN2 and the B-phase input line BIN2, respectively, connected to the second three-phase counter 15*b*. The switching part 16 disconnects the third input circuit 21*c* and the sixth input circuit 21*f* from the three-phase counters 15*a* and 15*b*.

The signal processing part 12 performs counting on the basis of two-phase pulse signals with the A phase and the B phase input to each of the first three-phase counter 15*a* and the second three-phase counter 15*b*. The signal processing part 12 transmits count results stored in buffers respectively corresponding to the first three-phase counter 15*a* and the second three-phase counter 15*b* to the PLC 30 via the communication part 11 in every predetermined communication period.

As described above, the counter unit 10 causes the three-phase counter that performs counting on the basis of three-phase pulse signals as a multi-phase counter that performs counting on the basis of both two-phase pulse signals and three-phase pulse signals, and thus supports the output apparatuses 50 of two-phase output and three-phase output.

That is, in this case, the first three-phase counter 15a and the second three-phase counter 15b function as the two-phase counter 14.

Figure 8:
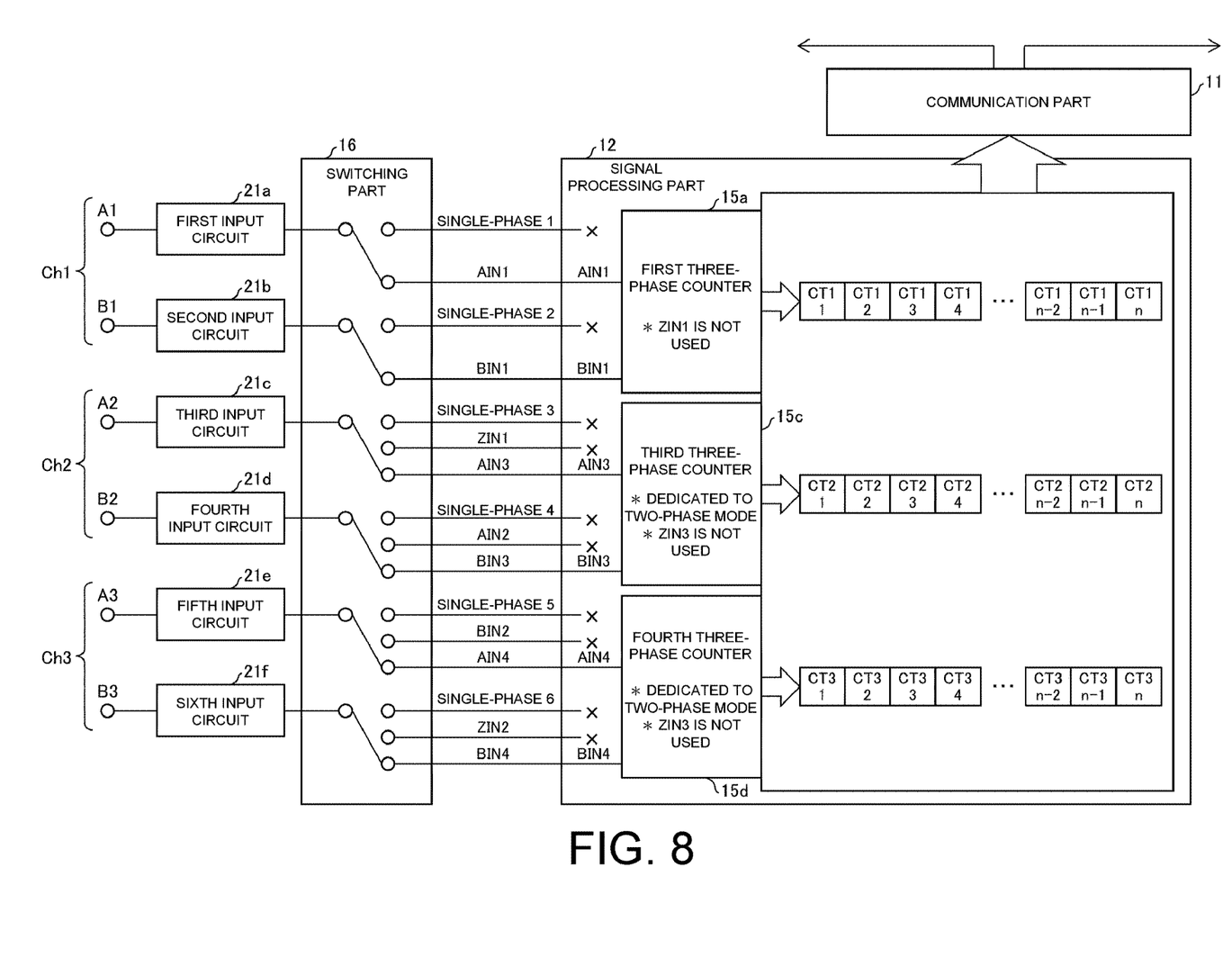
FIG. 8 is a wiring connection diagram of the counter unit in a two-phase mode in which the counter unit is used by being connected to the output apparatus of two-phase output.

FIG. 8 is a diagram illustrating an example of another wiring connection state of the counter unit 10 in a case where the counter unit 10 is used in the two-phase input mode. As illustrated in FIG. 8, the counter unit 10 may be configured such that the two-phase output apparatus 50 is connectable to each of the three channels Ch1, Ch2, and Ch3.

The first channel Ch1 includes the signal input terminals A1 and B1, the first input circuit 21a and second input circuit 21b respectively connected to the signal input terminals A1 and B1. The second channel Ch2 includes the signal input terminals A2 and B2, and the third input circuit 21c and the fourth input circuit 21d respectively connected to the signal input terminals A2 and B2. The third channel Ch3 includes the signal input terminals A3 and B3, and the fifth input circuit 21e and the sixth input circuit 21f respectively connected to the signal input terminals A3 and B3.

In addition to the first three-phase counter 15a and the second three-phase counter 15b, the signal processing part 12 includes a third three-phase counter 15c and a fourth three-phase counter 15d that are dedicated to the two-phase mode. That is, the signal processing part 12 causes the third three-phase counter 15c and the fourth three-phase counter 15d that are dedicated to the two-phase mode to function as the two-phase counter 14 that performs counting on the basis of two-phase pulse signals. The third three-phase counter 15c is connected to the switching part 16 via the A-phase signal line AIN3 and the B-phase signal line BIN3. The fourth three-phase counter 15d is connected to the switching part 16 via the A-phase signal line AIN4 and the B-phase signal line BIN4.

In a case where the output apparatus 50 of two-phase output is connected to each of the channels Ch1, Ch2, and Ch3, the user operates the notebook PC 40 to perform connection switching in the switching part 16 such that the first input circuit 21a and the second input circuit 21b are connected to the first three-phase counter 15a, the third input circuit 21c and the fourth input circuit 21d are connected to the third three-phase counter 15c, and the fifth input circuit 21e and the sixth input circuit 21f are connected to the fourth three-phase counter 15d.

The switching part 16 connects the first input circuit 21a and the second input circuit 21b to the A-phase signal line AIN1 and the B-phase signal line BIN1, respectively, connected to the first three-phase counter 15a. The switching part 16 connects the third input circuit 21c and the fourth input circuit 21d to the A-phase signal line AIN3 and the B-phase signal line BIN3, respectively, connected to the third three-phase counter 15c. The switching part 16 connects the fifth input circuit 21e and the sixth input circuit 21f to the A-phase signal line AIN4 and the B-phase signal line BIN4, respectively, connected to the fourth three-phase counter 15d.

The signal processing part 12 performs counting on the basis of two-phase pulses with the A phase and the B phase input to each of the first three-phase counter 15a, the third three-phase counter 15c, and the fourth three-phase counter 15d. The signal processing part 12 transmits count results stored in buffers respectively corresponding to the first three-phase counter 15a, the third three-phase counter 15c, and the fourth three-phase counter 15d to the PLC 30 via the communication part 11 in every predetermined communication period.

As described above, the counter unit 10 has a configuration in which the third three-phase counter 15c and the fourth three-phase counter 15d connected to the switching part 16 can be used exclusively for two-phase inputs such as the A-phase signal input and the B-phase signal input, and can thus be used by connecting three two-phase output apparatuses 50 to the six input signal terminals. Therefore, an unused input signal terminal is not generated, and the counter unit 10 can be used without waste.

(Summary)

In order to solve the above problems, the counter unit according to one aspect of the present invention includes a plurality of signal input terminals to which pulse signals output from a plurality of external output apparatuses are input, an input circuit that is connected to each of the plurality of signal input terminals, a single-phase counter that performs counting on the basis of a single-phase pulse signal and a multi-phase counter that performs counting on the basis of multi-phase pulse signals, and a switching part that switches between whether the input circuit is connected to the single-phase counter or the multi-phase counter.

According to the above configuration, since it is switched whether the input circuit connected to each of the plurality of signal input terminals is connected to the single-phase counter or the multi-phase counter, a plurality of output apparatuses can be connected with efficient use of a plurality of signal input terminals.

The counter unit according to one aspect of the present invention is a three-phase counter that performs counting on the basis of three-phase pulse signals.

In the counter unit according to one aspect of the present invention, the three-phase counter performs counting on the basis of both two-phase pulse signals and three-phase pulse signals.

According to the above configuration, the counter unit can support both an output apparatus that outputs two-phase pulse signals and an output apparatus that outputs three-phase pulse signals by using the three-phase counter.

In the counter unit according to one aspect of the present invention, each of the single-phase counter and the multi-phase counter includes a buffer for temporarily storing count results for a plurality of times, and the counter unit further includes a communication part that outputs the count results for the plurality of times temporarily stored in the buffer corresponding to each of single-phase counter and the multi-phase counters to a host device via a communication line in every predetermined communication period.

According to the above configuration, the count results for a plurality of times from the single-phase counter and the multi-phase counter can be collectively output to the host device in every predetermined communication period.

The counter unit according to one aspect of the present invention further includes a switching reception part that receives an instruction for a switching operation of the switching part via a communication line.

According to the above configuration, it is possible to control the switching operation from the outside via the communication line.

The present invention is not limited to the above-described respective embodiments, and various modifications can be made within the scope of the claims, and the embodiments obtained by appropriately combining the technical means disclosed in the different embodiments are also included in the technical scope of the present invention.

REFERENCE SIGNS LIST

1 Control system
10 Counter unit
11 Communication part
12 Signal processing part
13 Single-phase counter
15 Three-phase counter (multi-phase counter)
16 Switching part
22 USB communication part (switching reception part)
21 Input circuit group
21a to 21f Input circuit
30 PLC (host device)
50 Output apparatus
A1, A2, B1, B2, Z1, Z2 Signal input terminal

The invention claimed is:

1. A counter unit comprising:
a plurality of signal input terminals to which pulse signals output from a plurality of external output apparatuses are input;
an input circuit that is connected to each of the plurality of signal input terminals;
a single-phase counter that performs counting based on a single-phase pulse signal, and a multi-phase counter that performs counting based on multi-phase pulse signals, wherein the multi-phase counter is a three-phase counter that performs counting based on both two-phase pulse signals and three-phase pulse signals; and
a switching part that switches between whether the input circuit is connected to the single-phase counter or the multi-phase counter.

2. The counter unit according to claim 1,
wherein each of the single-phase counter and the multi-phase counter has a buffer that temporarily stores count results for a plurality of times, and
wherein the counter unit further comprises a communication part that outputs the count results for the plurality of times temporarily stored in the buffer corresponding to each of the single-phase counter and the multi-phase counter to a host device via a communication line in every predetermined communication period.

3. The counter unit according to claim 1, further comprising:
a switching reception part that receives an instruction for a switching operation of the switching part via a communication line.

4. The counter unit according to claim 2, further comprising:
a switching reception part that receives an instruction for a switching operation of the switching part via a communication line.

* * * * *